(12) United States Patent
Ma et al.

(10) Patent No.: US 10,231,351 B2
(45) Date of Patent: Mar. 12, 2019

(54) HOUSING, METHOD FOR MAKING THE SAME, ELECTRONIC DEVICE, AND AUTOMOTIVE INTERIOR COMPONENT

(71) Applicant: MiiCs & Partners (Shenzhen) Co., Ltd., Shenzhen (CN)

(72) Inventors: Hung-Chun Ma, New Taipei (TW);
Han-Lung Lee, New Taipei (TW);
Yu-Lin Liao, New Taipei (TW);
Chih-Jung Chang, New Taipei (TW);
Hung-Lien Yeh, New Taipei (TW);
Jih-Chen Liu, New Taipei (TW);
Feng-Yuen Dai, New Taipei (TW)

(73) Assignee: MiiCs & Partners (Shenzhen) Co., Ltd., Shenzhen (CN)

( * ) Notice: Subject to any disclaimer, the term of this patent is extended or adjusted under 35 U.S.C. 154(b) by 730 days.

(21) Appl. No.: 14/699,697

(22) Filed: Apr. 29, 2015

(65) Prior Publication Data
US 2016/0227658 A1    Aug. 4, 2016

(30) Foreign Application Priority Data

Feb. 2, 2015 (TW) .............................. 104103487 A

(51) Int. Cl.
| | | |
|---|---|---|
| H05K 5/02 | (2006.01) | |
| H05K 5/03 | (2006.01) | |
| G06F 1/16 | (2006.01) | |
| H05K 5/00 | (2006.01) | |
| H04M 1/02 | (2006.01) | |
| B60R 13/02 | (2006.01) | |
| H04M 1/04 | (2006.01) | |

(52) U.S. Cl.
CPC .............. *H05K 5/03* (2013.01); *B60R 13/02* (2013.01); *G06F 1/1626* (2013.01); *H04M 1/0202* (2013.01); *H05K 5/0086* (2013.01); *H05K 5/0217* (2013.01); *H04M 1/04* (2013.01)

(58) Field of Classification Search
CPC ..... H04M 1/0202; H04M 1/04; G06F 1/1626; B60R 13/02; H05K 5/0217; H05K 5/03; H05K 5/0086
See application file for complete search history.

(56) References Cited

U.S. PATENT DOCUMENTS

| | | | |
|---|---|---|---|
| 2008/0277050 A1* | 11/2008 | Liu ........................ | B41M 5/035 156/230 |
| 2015/0342069 A1* | 11/2015 | Foong .................... | H05K 3/303 361/749 |

FOREIGN PATENT DOCUMENTS

DE       102004029981 A1 *  1/2006   ............. B29C 51/10

\* cited by examiner

*Primary Examiner* — Mathieu D Vargot
(74) *Attorney, Agent, or Firm* — ScienBiziP, P.C.

(57) ABSTRACT

A housing for an electronic device in the home or car includes a substrate and a composite layer. The composite layer is formed on a surface of the substrate. The composite layer includes an adhesive layer, an ink layer, and a protective layer. The adhesive layer is fully attached to the surface of the substrate. The ink layer is formed on a surface of the adhesive layer away from the substrate. The protective layer is formed on a surface of the ink layer away from the adhesive layer and the process is completed by half-curing and full curing processes. A method for making the housing also is provided.

8 Claims, 7 Drawing Sheets

HOUSING, METHOD FOR MAKING THE SAME, ELECTRONIC DEVICE, AND AUTOMOTIVE INTERIOR COMPONENT

FIELD

The subject matter herein generally relates to housings, and more particularly, to a housing for an electronic device or for an automotive interior component, and a method for making the housing.

BACKGROUND

Housings of electronic devices (such as mobile phones, tablet computers, and multimedia players) may include a substrate and a decorative or protective film formed on the substrate.

BRIEF DESCRIPTION OF THE DRAWINGS

Implementations of the present technology will now be described, by way of example only, with reference to the attached figures.

DETAILED DESCRIPTION

Figure 1:
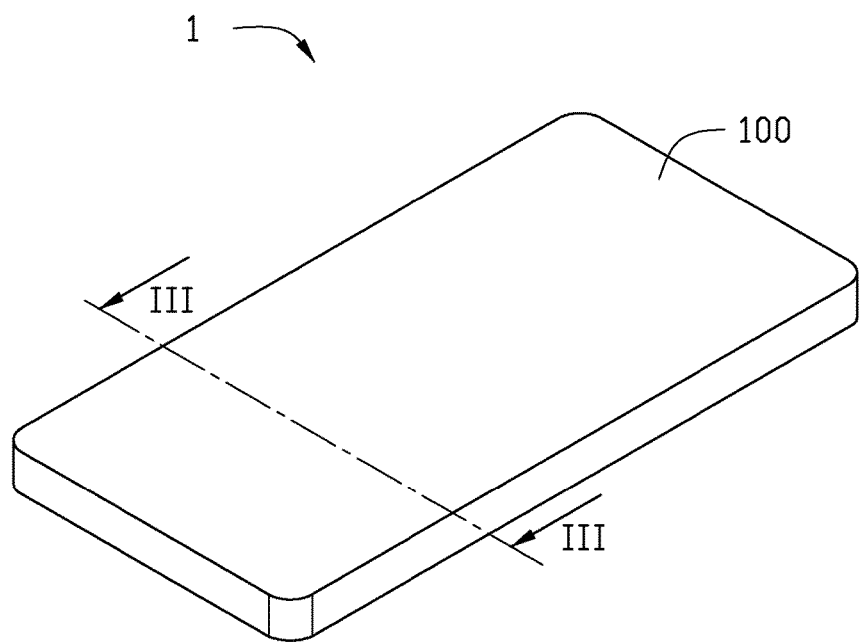
FIG. 1 is an isometric view of an embodiment of a housing for an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

Figure 2:
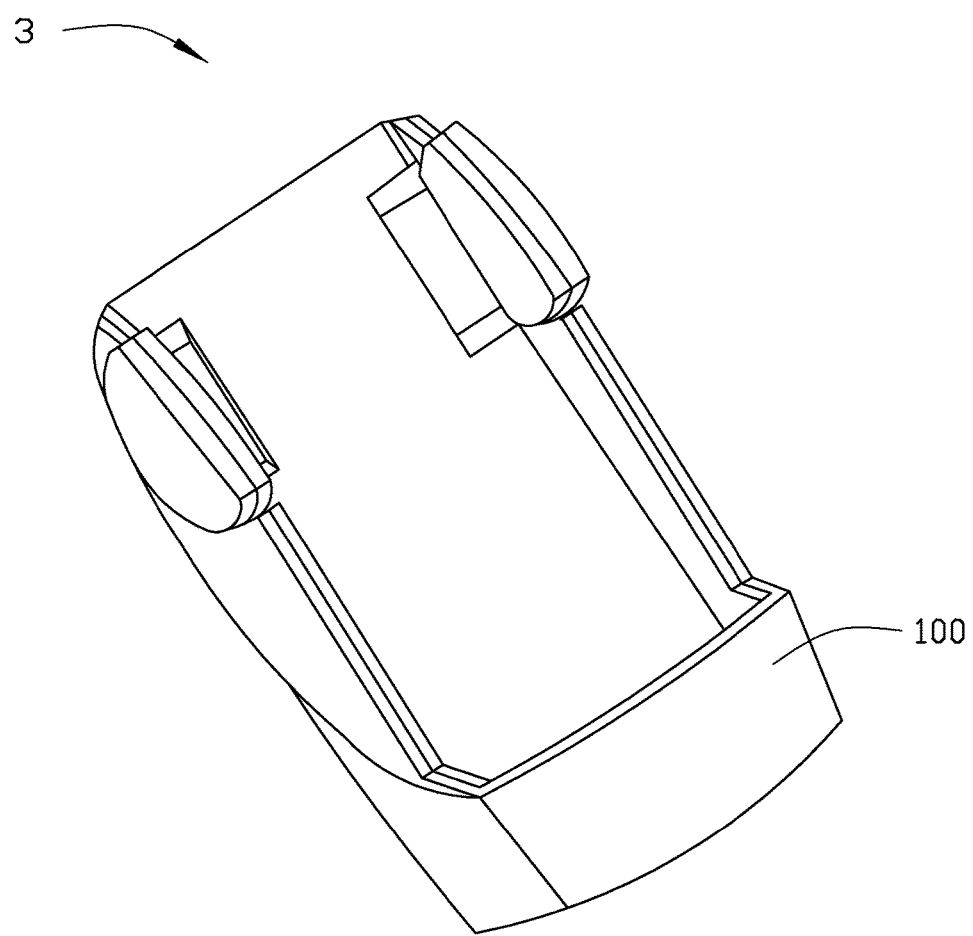
FIG. 2 is an isometric view of another embodiment the housing of FIG. 1 for an automotive interior component.
Figure 3:
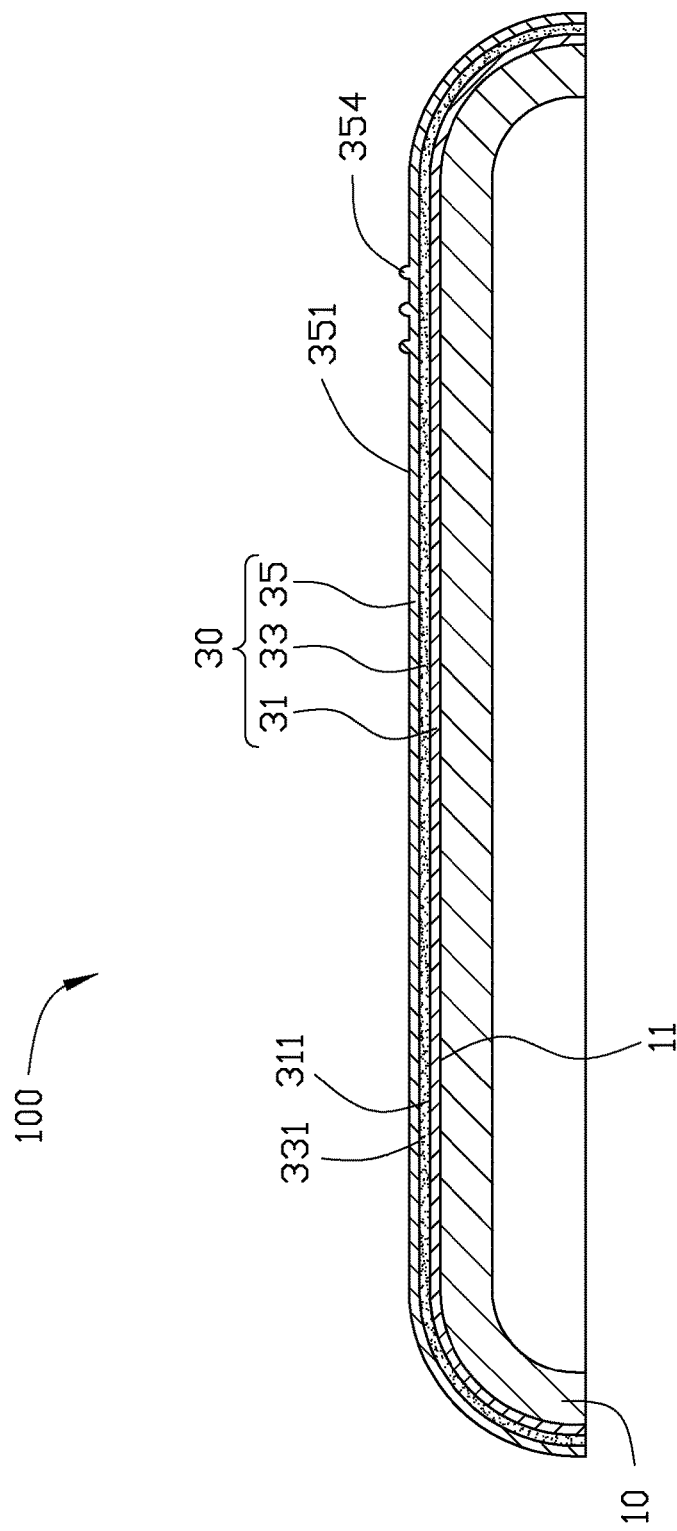
FIG. 3 is a cross-sectional view taken along line III-III of FIG. 1.

FIGS. 1-3 illustrate an embodiment of a housing 100 for an electronic device 1 or for an automotive interior component 3. The electronic device 1 can be a cell phone, a tablet computer, or a media player. The automotive interior component 3 can be a digital audio player dock or a cell phone holder.

The housing 100 includes a substrate 10 and a composite layer 30 formed on and in direct contact with the substrate 10. The substrate 10 can be made of a metal, a metal alloy, or a plastic.

The composite layer 30 includes an adhesive layer 31, an ink layer 33, and a protective layer 35. The adhesive layer 31 is fully attached to a surface 11 of the substrate 10. The adhesive layer 31 can be made of an ultraviolet-(UV-) curable adhesive. The adhesive layer 31 can have a thickness of about 5 μm to about 20 μm. The ink layer 33 is formed on a surface 311 of the adhesive layer 31 away from the substrate 10. The ink layer 33 can be made of an UV-curable ink. The ink layer 33 can be formed into a pattern and have a desired color to decorate the housing 100. The ink layer 33 can have a thickness of about 5 μm to about 20 μm. The adhesive layer 31 is used to improve the adhesion between the ink layer 33 and the substrate 10. The protective layer 35 is formed on a surface 331 of the ink layer 33 away from the adhesive layer 31. The protective layer 35 can be made of an acrylic resin and the protective layer 35 is transparent. The protective layer 35 can have a thickness of about 5 μm to about 20 μm. A hardness of the protective layer 35 tested by a MITSUBISHI pencil hardness tester is about 1 H/Kg.

In one embodiment, a surface 351 of the protective layer 35 away from the ink layer 33 has a three-dimensional (3D) relief pattern 354 (shown in FIG. 3). The 3D relief pattern 354 is defined by a plurality of projecting structures or structures which are concave.

Figure 4:
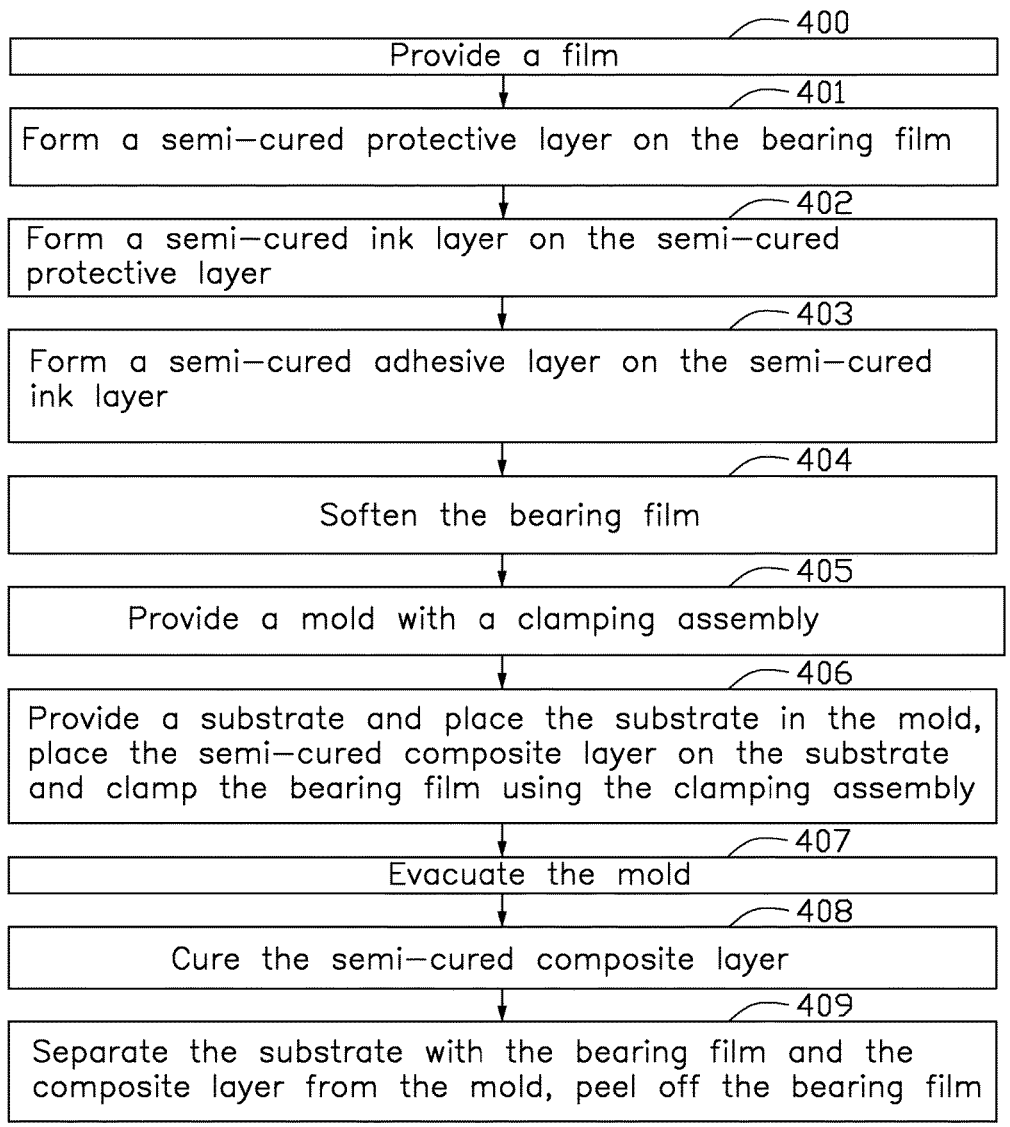
FIG. 4 is a flowchart of an embodiment of a method for making the housing of FIG. 1.

Referring to FIG. 4, a flowchart is presented in accordance with an exemplary embodiment. The exemplary method for making the housing 100 is provided by way of example, as there are a variety of ways to carry out the method. The method described below can be carried out using the configurations illustrated in FIGS. 1-3, for example, and various elements of these figures are referenced in explaining the example method. Each block shown in FIG. 4 represents one or more processes, methods or subroutines, carried out in the exemplary method. Furthermore, the illustrated order of blocks is by example only and the order of the blocks can change. Additional blocks may be added or fewer blocks may be utilized, without departing from this disclosure. The exemplary method can begin at block 400.

Figure 6:
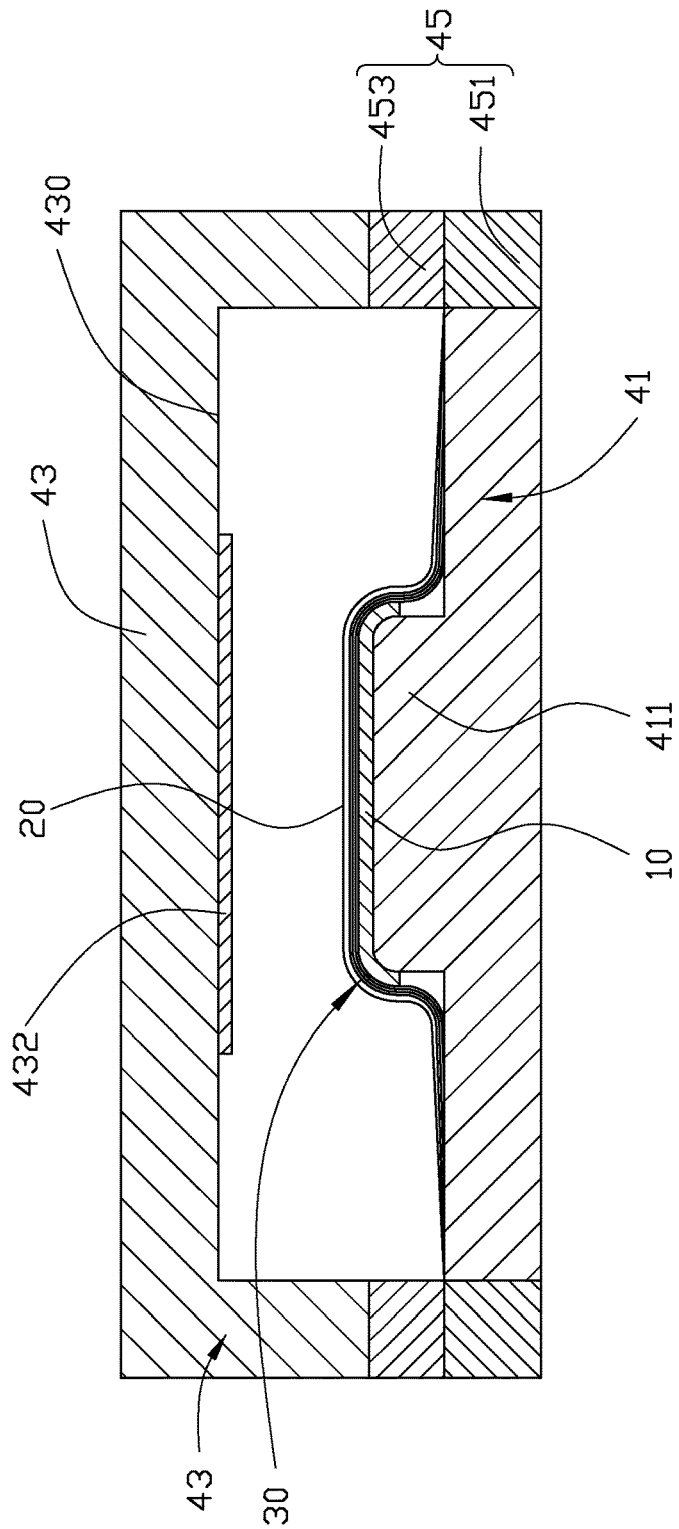
FIG. 6 is a cross-sectional view of an embodiment of a bearing film and a composite layer used in the mold of FIG. 5.
Figure 7:
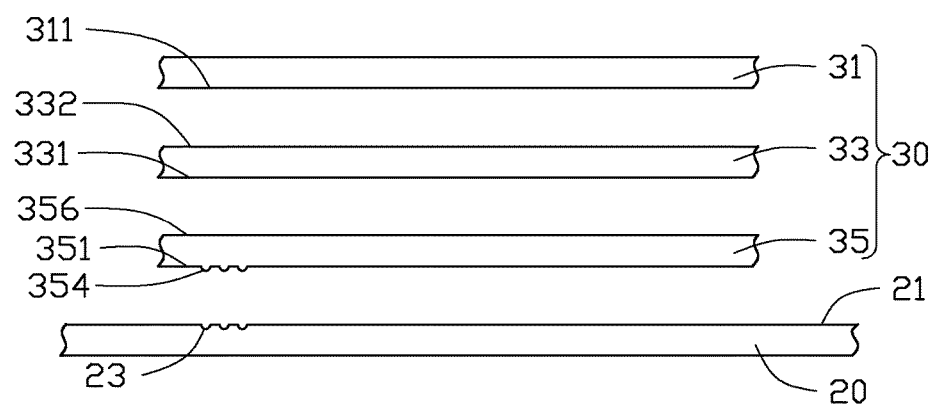
FIG. 7 is an exploded view of an embodiment of a bearing film and a composite layer of FIG. 6.

At block 400, a bearing film 20 (shown in FIG. 6-7) is provided. The bearing film 20 can be made of a polyolefin. More particularly, the bearing film 20 is made of a copolymer of polypropylene resin and polyethylene resin.

At block 401, a molten acrylic resin is coated onto a portion of one surface 21 of the bearing film 20. The acrylic resin is cooled to form a semi-cured protective layer 35 which remains soft and not fully solidified.

At block 402, a surface 356 of the semi-cured protective layer 35 away from the bearing film 20 is coated with UV-curable ink. The UV-curable ink is solidified by ultraviolet light to form a semi-cured ink layer 33 which remains soft and not fully solidified.

At block 403, a surface 332 of the semi-cured ink layer 33 away from the semi-cured protective layer 35 is coated with the UV-curable adhesive. The UV-curable adhesive is solidified by ultraviolet light to form a semi-cured adhesive layer 31 which remains soft and not fully solidified. A semi-cured composite layer 30 is formed by the semi-cured adhesive layer 31, the semi-cured ink layer 33, and the semi-cured protective layer 35.

At block 404, the bearing film 20 with the semi-cured composite layer 30 is further softened by heating. An infrared heating device (not shown) capable of emitting infrared light can be used to heat the bearing film 20 with the semi-cured composite layer 30.

Figure 5:
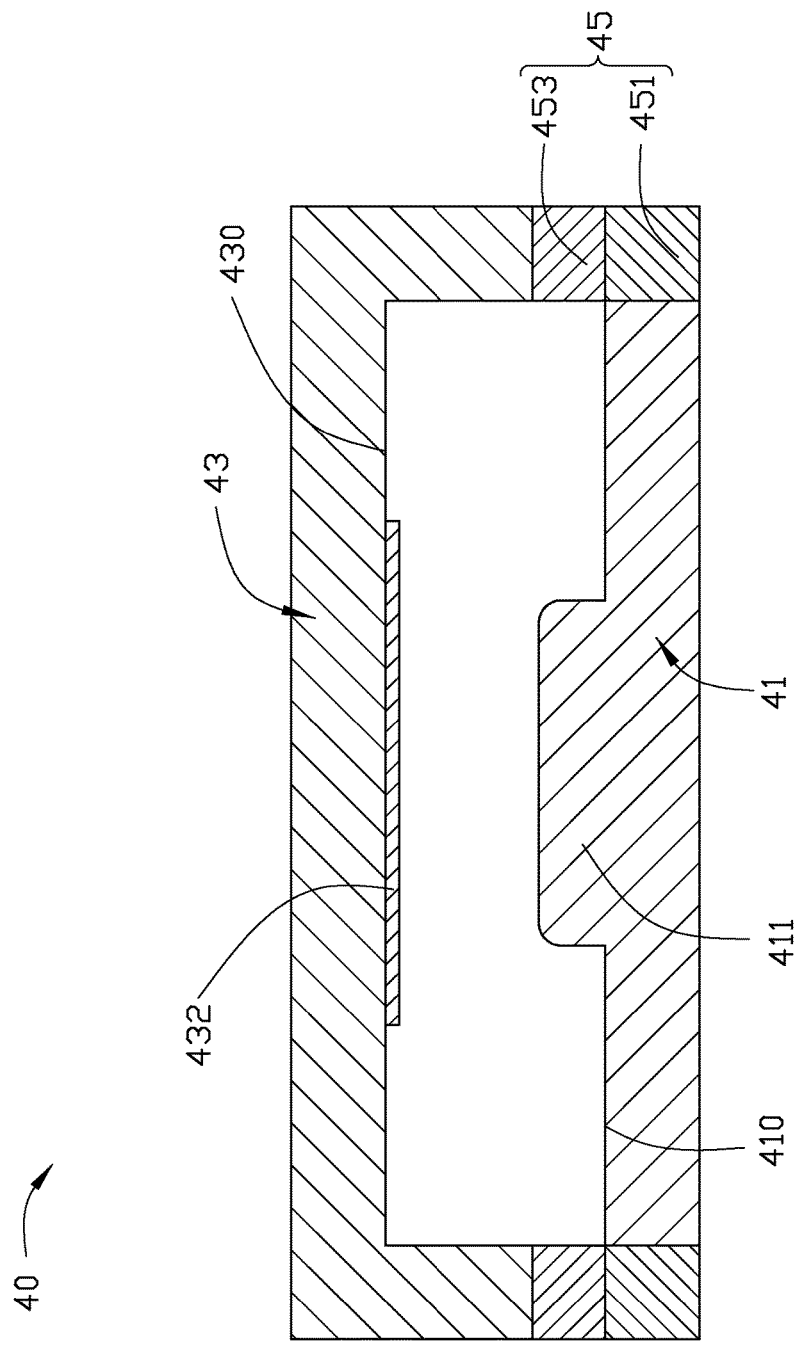
FIG. 5 is a cross-sectional view of an embodiment of a mold used in the method of FIG. 4.

At block 405, a mold 40 (shown in FIG. 5) including a female mold 41, a male mold 43, and a clamping assembly 45 is provided. A molding surface 410 of the female mold 41 has a positioning station 411 thereon. The clamping assembly 45 includes a first portion 451 and a second portion 453. The first portion 451 and the second portion 453 are mounted to the edges of ends of the female mold 41 and the male mold 43 so as to face each other. When the female mold 41 and the male mold 43 are closed together, the first portion 451 coordinates with the second portion 453 to clamp the bearing film 20. A molding surface 430 of the male mold 43 has an ultraviolet light source 432 positioned thereon.

At block 406, a substrate 10 is provided, and the substrate 10 is placed on the positioning station 411. The softened bearing film 20 with the semi-cured composite layer 30 is placed on the substrate 10 with the semi-cured composite layer 30 facing the substrate 10. The female mold 41 and the male mold 43 are closed together to clamp two ends of the softened bearing film 20 by the clamping assembly 45. The clamping assembly 45 applies a force away from the male mold 43 on the softened bearing film 20 to press the adhesive layer 31 of the semi-cured composite layer 30 into tight contact with the surface 11 of the substrate 10.

At block 407, the mold 40 is evacuated to cause the semi-cured adhesive layer 31 to attach fully and permanently to the surface 11 of the substrate 10. The mold 40 is in a negative pressure condition and the clamping assembly 45 clamps the bearing film 20 to force the bearing film 20 with the semi-cured composite layer 30 tightly against the surface 11 of the substrate 10. The semi-cured adhesive layer 31 thus becomes fully attached to the surface 11 of the substrate 10 whether the surface 11 of the substrate 10 be rough or smooth.

At block 408, the ultraviolet light source 432 emits ultraviolet light to fully cure the semi-cured composite layer 30. Furthermore, the acrylic resin includes a photoinitiator to promote full curing of the semi-cured protective layer 35.

At block 409, the substrate 10 with the bearing film 20 and composite layer 30 is separated from the mold 40. The housing 100 is finished after peeling off the bearing film 20 from the substrate 10.

In at least one embodiment, the bearing film 20 forms a 3D relief pattern 23 by an impressing process for example. The 3D relief pattern 23 of the bearing film 20 is depressed into the acrylic resin when the bearing film 20 is coated with the molten acrylic resin, so that a 3D relief pattern 354 is formed on the surface 351 of the protective layer 35.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making a housing comprising:
providing a bearing film;
forming a semi-cured composite layer on a portion of a surface of the bearing film, the semi-cured composite layer comprising a semi-cured protective layer formed on the surface of the bearing film, a semi-cured ink layer formed on a surface of the semi-cured protective layer away from the bearing film, and a semi-cured adhesive layer formed on a surface of the semi-cured ink layer away from the semi-cured protective layer;
softening the bearing film;
providing a mold with a clamping assembly and providing a substrate;
placing the substrate in the mold, and placing the softened bearing film on a curved surface of the substrate with the semi-cured composite layer facing the substrate;
clamping the two ends of the softened bearing film using the clamping assembly to cause the semi-cured adhesive layer of the semi-cured composite layer to be in tight contact with the curved surface of the substrate;
evacuating the mold to cause the semi-cured adhesive layer to be fully attached to the substrate;
curing the semi-cured composite layer;
separating the substrate with the bearing film and the cured composite layer from the mold; and
peeling off the bearing film from the cured composite layer to obtain the housing.

2. The method of the claim 1, wherein the adhesive layer is made of an ultraviolet curable adhesive, and the adhesive layer has a thickness of about 5 µm to about 20 µm.

3. The method of the claim 1, wherein the ink layer is made of an ultraviolet curable ink, and the ink layer has a thickness of about 5 µm to about 20 µm.

4. The method of the claim 1, wherein the protective layer is made of an acrylic resin, and the protective layer has a thickness of about 5 µm to about 20 µm.

5. The method of the claim 4, wherein the bearing film is made of a copolymer of polypropylene resin and polyethylene resin, a three-dimensional relief pattern is formed on the surface of the bearing film, and the 3D relief pattern is depressed into the surface of the protective layer away from the ink layer.

6. The method of the claim 4, wherein the mold comprises a female mold and a male mold, a molding surface of the female mold comprises a positioning station, the clamping assembly comprises a first portion and a second portion, the first portion and the second portion are respectively mounted to peripheral edges of ends of the female mold and the male mold facing to each other, the female mold coordinates with the male mold to clamp the bearing film.

7. The method of the claim 6, wherein a molding surface of the male mold has an ultraviolet light source to emit ultraviolet to cure the semi-cured composite layer.

8. The method of the claim 7, wherein the acrylic resin comprises a photoinitiator to cause the semi-cured protective layer be fully cured when the ultraviolet light source emits ultraviolet.

* * * * *